US009032142B2

(12) United States Patent
Sun (10) Patent No.: US 9,032,142 B2
(45) Date of Patent: May 12, 2015

(54) SYSTEM AND METHOD FOR STORING INTEGER RANGES IN A MEMORY

(75) Inventor: Yan Sun, Santa Clara, CA (US)

(73) Assignee: Broadcom Corporation, Irvine, CA (US)

( * ) Notice: Subject to any disclaimer, the term of this patent is extended or adjusted under 35 U.S.C. 154(b) by 269 days.

(21) Appl. No.: 13/535,984

(22) Filed: Jun. 28, 2012

(65) Prior Publication Data

US 2014/0003112 A1    Jan. 2, 2014

(51) Int. Cl.
*G06F 12/02* (2006.01)
*G11C 15/00* (2006.01)
*H04L 12/743* (2013.01)

(52) U.S. Cl.
CPC ............ *G11C 15/00* (2013.01); *H04L 45/7457* (2013.01)

(58) Field of Classification Search
USPC .......................................................... 711/108
See application file for complete search history.

(56) References Cited

U.S. PATENT DOCUMENTS 6,018,524 A    1/2000 Turner et al.
2006/0262583 A1*   11/2006 Venkatachary ................. 365/49

OTHER PUBLICATIONS

Waldvogel, et al., "Scalable High Speed IP Routing Lookups," Proc. ACM SIGCOMM, 1997.

Gupta, et al., "Packet Classification using Hierarchical Intelligent Cuttings," IEEE Symposium on High Performance Interconnectes (Hotl), 1999.
Gupta, et al. "Packet Classification on Multiple Fields," in ACM SIGCOMM, Aug. 1999.
Baboescu, et al., "Packet Classification for Core Routers: Is there an alternative to CAMs?", IEEE Infocom, 2003.
Singh, et al., "Packet Classification using Multidimensional Cutting," ACM SIGCOMM, 2003.
Taylor, et al., "ClassBench: A Packet Classification Benchmark," Tech. Rep. WUCSE- 2004-28, Department of Computer Science and Engineering, Washington University in Saint Louis, May 2004.
Sun, et al., "A Hybrid Approach to CAM-Based Longest Prefix Matching for IP Route Lookup," Proc. Global Telecommunications Conference (GLOBECOM 2010), Dec. 2010.

* cited by examiner

*Primary Examiner* — Yong Choe
(74) *Attorney, Agent, or Firm* — Sterne, Kessler, Goldstein & Fox P.L.L.C.

(57) ABSTRACT

Methods, systems, and computer readable storage medium directed to efficiently storing value ranges in TCAM or other memory are disclosed. Storing a range of integer values in a memory includes determining a subrange within the range, so that, in a first and a second plurality of bit subsequences from binary representations respectively of a start value and an end value of the subrange, all except at most one bit subsequence in the first plurality is either equal in value to a corresponding bit subsequence in the second plurality or has a value of 0 and a corresponding bit subsequence of the second plurality has a maximum value. The storing a range of integer values in a memory further includes forming a first bit string based upon values of the first and second plurality of bit subsequences, and storing the first bit string in the memory.

20 Claims, 8 Drawing Sheets

|   | binary | | decimal |
|---|---|---|---|
| | 00001 | = | 1 |
| | 00010 | = | 2 |
| | 00011 | = | 3 |
| | 00100 | = | 4 |
| | 00101 | = | 5 |
| | 00110 | = | 6 |
| | 00111 | = | 7 |
| | 01000 | = | 8 |
| | 01001 | = | 9 |
| | 01010 | = | 10 |
| | 01011 | = | 11 |
| 101 | 01100 | = | 12 |
| | 01101 | = | 13 |
| | 01110 | = | 14 |
| | 01111 | = | 15 |
| | 10000 | = | 16 |
| | 10001 | = | 17 |
| | 10010 | = | 18 |
| | 10011 | = | 19 |
| | 10100 | = | 20 |
| | 10101 | = | 21 |
| | 10110 | = | 22 |
| | 10111 | = | 23 |
| | 11000 | = | 24 |

Range to be stored:   1-24
Prefix-based entries:
    00001:   1
    0001x:   2-3
    001xx:   4-7
    01xxx:   8-15
    10xxx:   16-23
    11000:   24

Example 1:
Let Width=8, Range = [11, 54], Chunk size =3
a = 11:   00 001 011  (0 1 3)
b = 54:   00 110 110  (0 6 6)   — Value (decimal) sequences 205
                                 bit subsequence 204
                                 bit sequence 202

Subranges         TCAM Entries
(0 1 3) — (0 1 7)   (000 0000001 xxxx111)
(0 2 0) — (0 5 7)   (000 00xxx11 xxxxxxx)   ~212
(0 6 0) — (0 6 6)   (000 0111111 0xxxxxx)
                                 bit substring 208
210                              bit string 206

FIG. 2A

Example 2:
Let Width=12, Chunk size =3
a = (1 2 4 5)
b = (1 6 1 3)   ~260

Ranges and TCAM entries:

| (1 2 4 5)—(1 2 4 7) | 0000001 0000011 0001111 xx11111 |
| (1 2 5 0)—(1 2 7 7) | 0000001 0000011 0011111 xxxxxxx |
| (1 3 0 0)—(1 5 7 7) | 0000001 00xx111 xxxxxxx xxxxxxx |
| (1 6 0 0)—(1 6 0 7) | 0000001 0111111 0000000 xxxxxxx |
| (1 6 1 0)—(1 6 1 3) | 0000001 0111111 0000001 1111xxx |

SYSTEM AND METHOD FOR STORING INTEGER RANGES IN A MEMORY

BACKGROUND

1. Field of the Invention

Embodiments of this invention are related to storing values in memory.

2. Background Art

Packet processing devices, such as routers, switches, bridges, and the like, are required to accommodate increasing bandwidth and processing requirements. For example, increases in bandwidth requires that each packet is processed in a packet processing device at near wire speeds, while simultaneously the number of packets entering the packet processing device gets larger. Moreover, complex packet processing may require the packet processing device to compare larger groups of fields in packet headers to preconfigured values.

In many packet processing devices, packet header fields are compared to entries in a ternary content accessible memory (TCAM). A TCAM is a table of entries in which values can be stored using binary (e.g., 1 and 0) bits as well as wildcard bits. A "wildcard" indicates that the corresponding bit can be a 1 or a 0. Some specific techniques by which 1, 0, and wildcards are stored are known in the art and may be implementation dependent. Each entry in a TCAM may correspond to one or more fields. An incoming packet may be compared to all entries in a TCAM in parallel. Other memory data structures, too, may be used in performing lookup based upon incoming packet fields.

Examined packet header fields can include Internet Protocol (IP) addresses, port values, protocol values, virtual local area network identifiers (VLANID), and other header fields. Some of the header fields are compared to specific values. Other header fields may be compared to ranges of values. Ranges of IP addresses can often be represented using common prefixes. A "prefix" is a sequence of one or more bits starting at the beginning of a binary representation of a value. As used herein, two or more values are said to have a common prefix if the binary representation of each value has a sequence of one or more bits starting at the first bit common with others in the two or more values. However, ranges of integer values (such as that used to represent port values, protocol identifiers, etc. in packet headers) may not be represented efficiently using prefixes. For example, storing a range of values may require a relatively high number of prefixes, and each prefix may require multiple entries in a TCAM. Each prefix for the range, for example, may require multiple TCAM entries in order to be compared in combinations of other fields.

Thus, the number of entries required in TCAM and other lookup structures in memory to store ranges of values may be excessive. TCAMs are frequently used for lookup operations due to their speed and flexibility. However, due to the relatively high power consumption and cost of TCAMs, a need exists to reduce the size of the TCAMs. Other memory too can be used for lookup, and can yield benefits from having fewer entries in lookup tables.

BRIEF SUMMARY

Embodiments of the present disclosure include methods, systems, and computer readable storage media directed to efficiently storing value ranges in a TCAM or other memory. Storing a range of integer values in a memory includes determining a subrange within the range, so that, in a first and a second plurality of bit subsequences from binary representations respectively of a start value and an end value of the subrange, all except at most one bit subsequence in the first plurality is either equal in value to a corresponding bit subsequence in the second plurality or has a value of 0 and a corresponding bit subsequence of the second plurality has a maximum value. The storing a range of integer values in a memory further includes forming a first bit string based upon values of the first and second plurality of bit subsequences, and storing the first bit string in the memory.

Further features and advantages of the present disclosure, as well as the structure and operation of various embodiments thereof, are described in detail below with reference to the accompanying drawings. It is noted that the disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

Reference will be made to the embodiments of the disclosure, examples which may be illustrated in the accompanying figures. These figures are intended to be illustrative, not limiting. Although the disclosure is generally described in the context of these embodiments, it should be understood that it is not intended to limit the scope of the disclosure to these particular embodiments.

DETAILED DESCRIPTION

While the present disclosure is described herein with reference to illustrative embodiments for particular applications, it should be understood that the disclosure is not limited thereto. Those skilled in the art with access to the teachings herein will recognize additional modifications, applications, and embodiments within the scope thereof and additional fields in which the disclosure would be of significant utility.

Embodiments disclosed in the specification provide for more efficient storing of integer ranges in TCAM and other memory structures. For example, embodiments enable storing a range of integers in a TCAM using substantially fewer entries than required by conventional techniques. The use of fewer entries to store a range may result in a lower cost TCAM or other memory used for the table of entries, improved efficiency in lookup, and the ability to compare a larger number of fields.

Figure 1A:
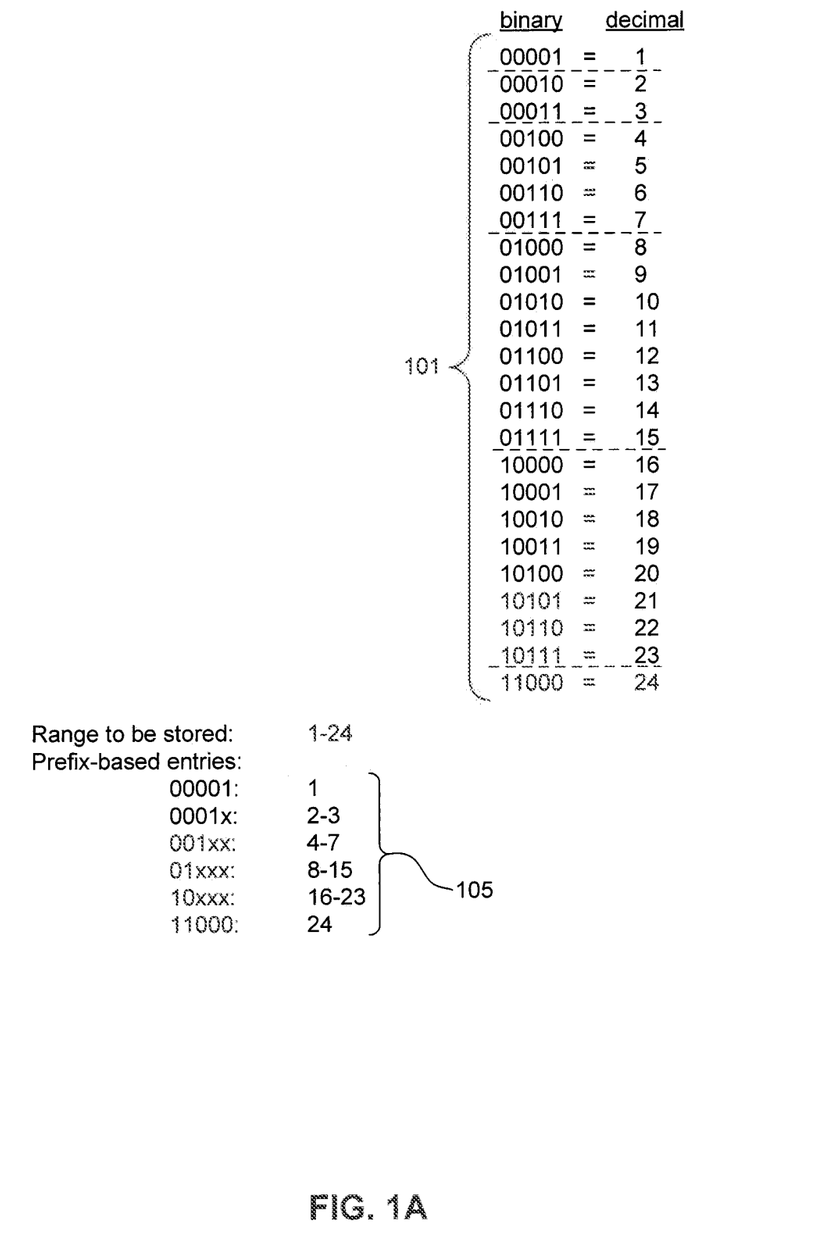
FIG. 1A illustrates an exemplary conventional approach to storing a range of integer values in memory.

FIG. 1A illustrates an example conventional approach to storing a range of integer values in memory, such as TCAM or other memories. As shown in FIG. 1A, when using the conventional method of storing prefix-based ranges, at least six prefixes must be used to cover the range of integers 1-24. The respective values in the range 1-24 are illustrated in binary as shown in item 101. Six subranges can be determined based upon common prefixes in the binary representations of the numbers. The six subranges are 1, 2-3, 4-7, 8-15, 16-23, and 24. Item 105 illustrates the smallest group of prefix-based field values that can be used to represent the range in TCAM entries. As illustrated, six separate prefixes are required to represent the range 1-24, namely, "00001","0001", "001", "01", "10", and "11000".

Figure 1B:
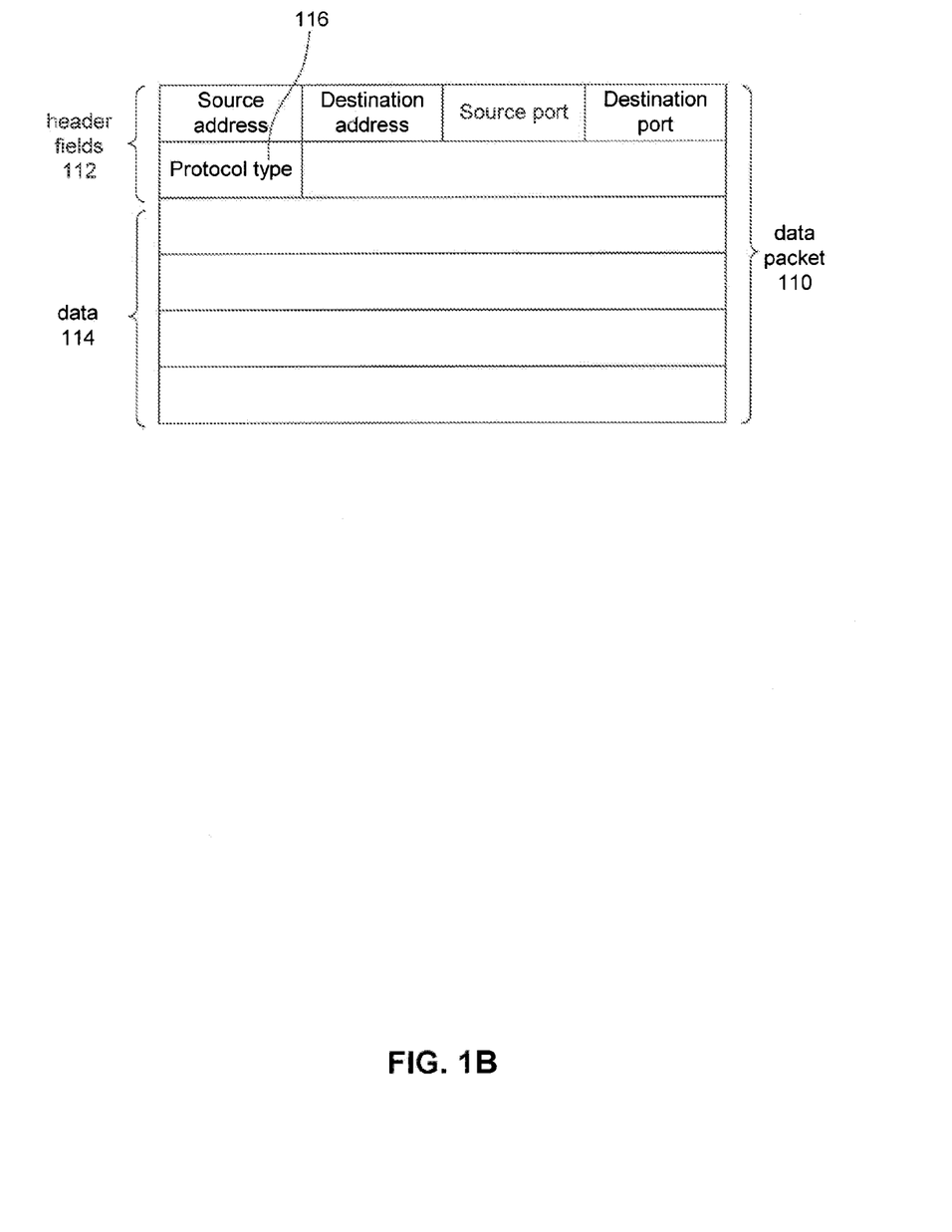
FIG. 1B illustrates an exemplary packet format.

FIG. 1B illustrates an exemplary format of a data packet 110 that can be processed in a packet processing device. A packet 110 may include a header fields portion 112 and a data portion 114. Header fields 112 includes one or more fields such as source address, destination address, source port, destination port, protocol type 116, and virtual local area network identifier (VLANID, not shown). Data portion 114 may include the actual data payload, or the actual data payload as encapsulated in one or more other protocol packet formats. Packets may be formatted in accordance with one or more communication protocols, such as, but not limited to, Internet Protocol (IP), Transmission Control Protocol (TCP), User Datagram Protocol (UDP), Ethernet, and the like. In the illustrated example, the source address and destination address may be IP addresses. Ranges of IP addresses, at least in part due to the hierarchical structure of an IP address, can be efficiently represented in the form of prefixes. Ranges of integer values, such as that against which the source port, destination port, and protocol type 116 fields can be compared, too, can be represented as prefix-based fields as shown in FIG. 1A. However, as described in relation to FIG. 1A, prefix-based representation of integer ranges can require a very large number of TCAM entries, wasting memory space and power. This is particularly so because each of the prefixes are combinable with combinations of other fields to be compared. Embodiments disclosed in this specification enable the storing of integer ranges, such as, but not limited to, ranges of values that can be used to compare port and protocol type 116 fields in packets 110.

Figure 2A:
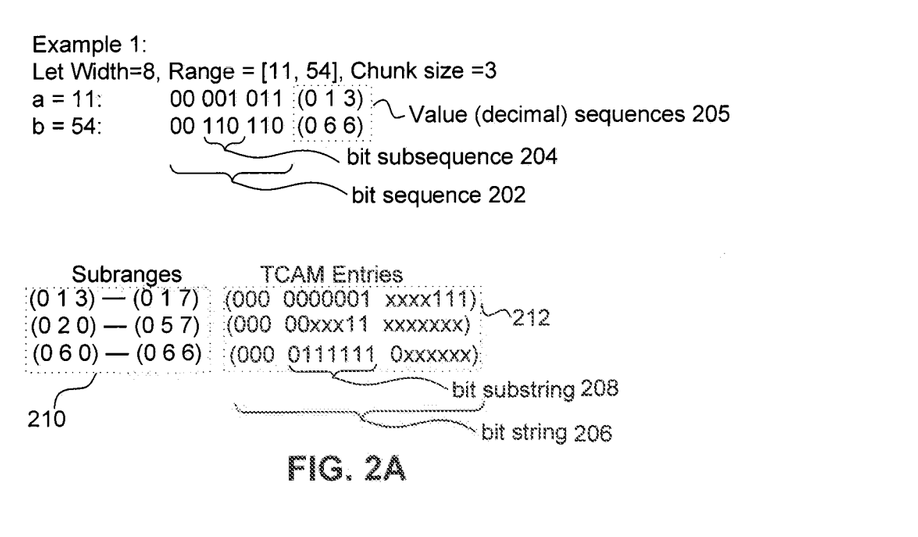
FIGS. 2A-2B illustrate exemplary ranges and entries in memory representing the ranges, according to an embodiment of the present disclosure.
Figure 2B:
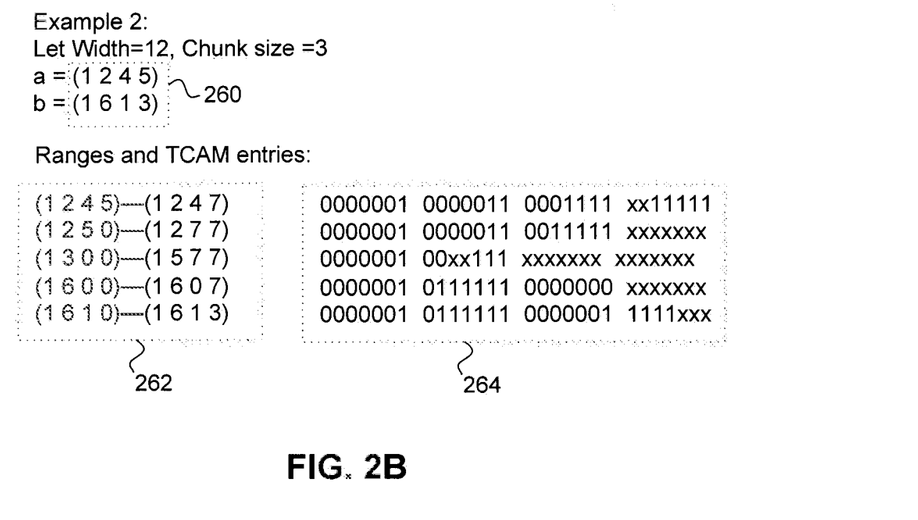

FIGS. 2A-2B illustrate exemplary ranges and entries in a TCAM or other memory representing the ranges, according to an embodiment of the present disclosure.

FIG. 2A illustrates the storing of the range of integers 11-54 in TCAM according to an embodiment. The binary representations of the boundary (e.g. start and end) points of the range (e.g., 11-54) are specified using 8 bit wide binary bit sequences 202. Each binary bit sequence 202 is divided to 3 bit wide chunks of binary bit subsequences 204. A chunk size of 3 bits may be configurable or may be dynamically determined. Then, the boundary points of the range are represented as sequences 205 of elements, referred to as value sequences, comprising the corresponding determined values represented by the 3 bit chunks. Each element in a sequence corresponds to a chunk. For purposes of illustration and explanation, the value sequences are shown as decimal value sequences. e.g. (0 1 3) and (0 6 6). The illustrated chunk size is not meant to be limiting.

The range is then divided into several subranges, for example, as illustrated by the three subranges 210 that cover the range 11-54. The subranges (e.g., [0 1 3]-[0 1 7], [0 2 0]-[0 5 7], [0 6 0]-[0 6 6]) are generated so that, the boundaries of any subrange, when that subrange is represented as a pair of value sequences corresponding to the boundary points of that subrange, is consistent with a set of predetermined properties. The set of predetermined properties include having matching values in each pair of corresponding elements between the two decimal sequences except for at most one pair. A pair of corresponding elements comprises an element from each boundary point of the subrange. For example, in FIG. 2A, the subrange (0 1 3)-(0 1 7) has only the third element different between the start and end points of the subrange. A particular pair of elements from the value sequences is exempt from the property of having matching values when the entire permissible range of values for the corresponding chunk is valid for a particular pair of elements. For example, in the subrange (0 2 0)-(0 5 7), shown in FIG. 2A, both the second and third elements are different, but the third element accommodates the entire range of values for the 3 bit chunk. Specifically, the entire range that can be represented using 3 bits (e.g., integer values 0-7) is accommodated between the third element (e.g., 0) of the start point and the third element (e.g., 7) of the end point. The third subrange, (0 6 0)-(0 6 6) has only the third element different between the two boundary points.

Each subrange, specified as a value sequence, is then represented as a bit string that is stored in embodiments as a TCAM entry 212 or as an entry in another memory. As illustrated in FIG. 2A, the value sequences of a subrange from subranges 210 are used in determining an entry, from one of the entries 212, corresponding to that subrange. Each bit string 206 includes a plurality of bit substrings 208. The number of bit substrings 208 in a bit string 206 is equal to the number of elements in a corresponding one of the decimal sequences. Each bit substring 208 represents the integer values that lie between the values of the corresponding pair of elements in the value sequence. In an embodiment, bit string "000 0000001 xxxx111" is the entry stored in a memory or TCAM for the subrange (0 1 3)-(0 1 7). Each bit in a bit substring represents a distinct integer between the values of the corresponding chunks in the two boundary points. For example, starting from the left, the first bit represents integer "1", the second bit represents integer "2", etc. In the above example bit string, the first bit substring is "000" illustrating that there are no integers, other than 0, between the respective first elements of the two decimal sequences. The second bit substring "0000001" represents that "1" is the only integer between the respective second elements of the two decimal sequences. The third bit substring "xxxx111" represents those integers 3-7 that occur between the respective first elements of the third decimal sequences. The "x" is a special value (e.g., wildcard or "don't care bit") indicating that any place where x occurs may have either a 0 or a 1 in the bit string. Note that, in order to represent the integer 3 in a bit substring, the bit that represents 3 as well as all less significant bits are set to 1.

Described differently, each bit substring represents the range of valid values for a corresponding chunk. As described below, a header field value of an incoming packet is used to derive a sequence of chunks, and each chunk is compared to a corresponding bit substring of one or more bit strings. The above described first, second, and third bit substrings (of bit string "000 0000001 xxxx111") would, for example, match any packet header value which has a first, second and third chunk in a sequence of chunks as, 0, 1 and any value between 3-7 inclusive, respectively. The bit substrings may be considered to have bit encoded (also referred to as "bit coded" or "bit-wise coded") the values of the respective chunks (or bit subsequences).

FIG. 2B illustrates the storing of the range of integers 677-947. The field value to be represented is a 12 bit integer, and can, therefore, be partitioned to four 3 bit chunks. Thus, the chunked binary representation of the range (e.g., 001 010 100 101-001 110 001 011) yields the boundary points as (1 2 4 5)-(1 6 1 3) in value sequences in decimal (illustrated as item 260). Subsequences (item 262) are then derived based upon value sequences 260 of the range. As described above, between the value sequences of a start point and an end point of a particular subrange, each element except at most one from the start point value sequence would be the same as the corresponding element from the end point value sequence unless that pair of elements accommodate the entire range of values for the corresponding chunk (e.g. values 0-7 for a chunk of 3 bits). For example, the first subrange (1 2 4 5)-(1 2 4 7) differs only in the fourth element. The second subrange (1 2 5 0)-(1 2 7 7) differs in the third and fourth elements, but the fourth element accommodates the full range of values 0-7 for that corresponding 3 bit chunk. The third subrange (1 3 0 0)-(1 5 7 7) differs in the second, third and fourth elements, but the third and fourth elements each accommodates the full range of the respective chunks. Item 264 illustrates bit strings stored in a TCAM corresponding to subranges 262. Another of the illustrated subranges, (1 6 0 0)-(1 6 0 7), differ only in the fourth element, which also accommodates the full range of valid values for the chunk.

Figure 3:
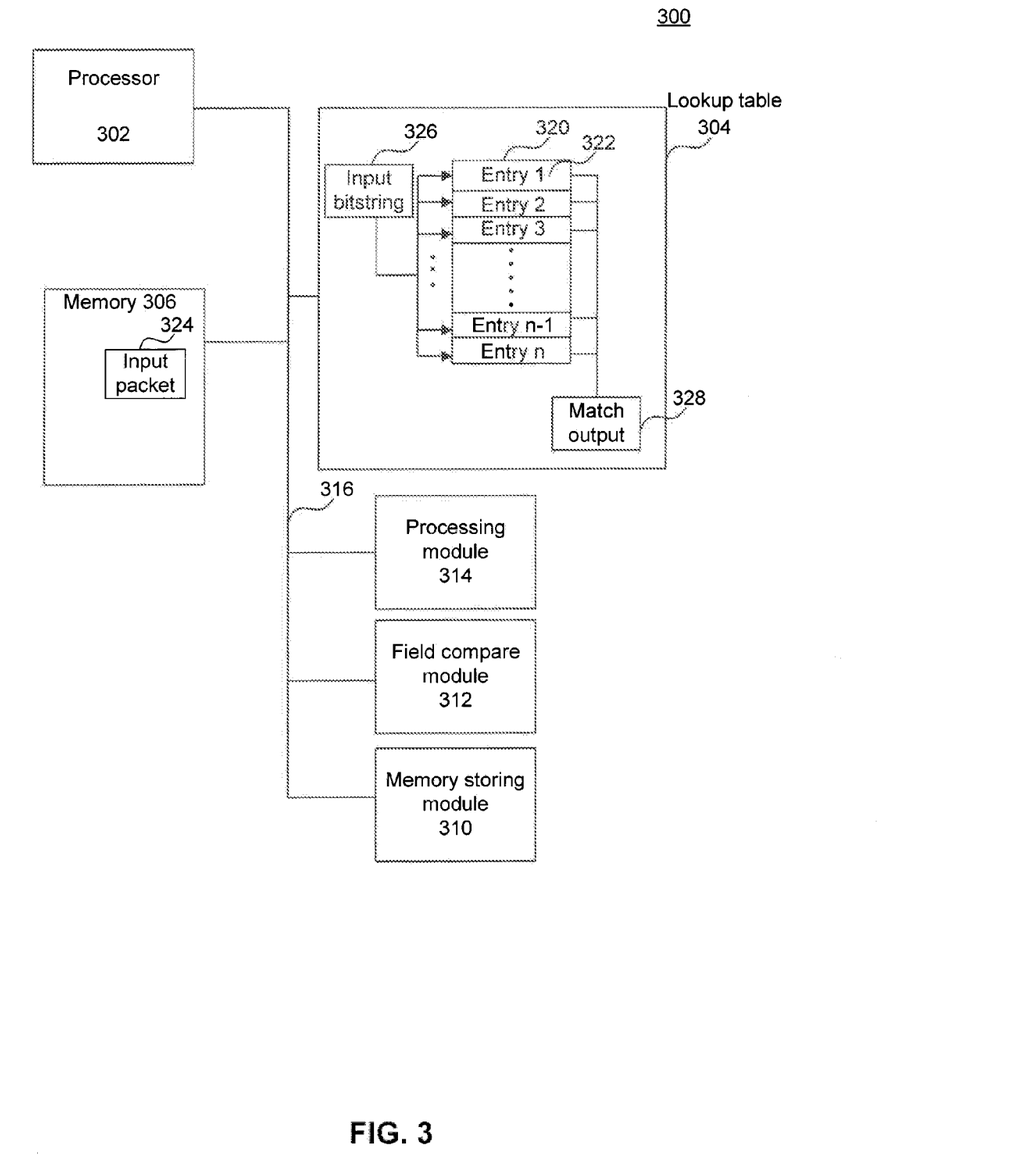
FIG. 3 illustrates an exemplary system for storing a range of integer values in a memory, according to an embodiment of the present disclosure.

FIG. 3 illustrates an exemplary system 300 for storing a range of integer values in a TCAM, according to an embodiment of the present disclosure. System 300 may include a packet processing device, database system, or other device or system that requires fast lookup operations. System 300 includes a processor 302, a lookup table 304, a memory 306, a memory storing module 310, a field compare module 312, a processing module 314 and a communication infrastructure (also referred to as "interconnection bus") 316.

Processor 302 may include any central processing unit (CPU), or specialized processors such as, but not limited to, application specific integrated circuit (ASIC) or field programmable gate array (FPGA). Processor 302 can execute logic instructions to control the operation of one or more components of system 300. Processor 302 may control the processing within system 300, and may, for example, execute, or control the execution of, one or more packet processing pipelines. The packet processing pipelines each comprise a logical view of the processing path of packets from entry into system 300 to exit from the system.

Lookup table 304 includes a data structure 320 that can be used to compare an input field value or a group of input field values of a corresponding packet to one or more stored values. Data structure 320 includes a plurality of entries 322. Each entry 322 may include the value to be compared to a single field, or a combination of values to be compared to a plurality of selected fields. According to an embodiment, data structure 320 is a TCAM. An input bit string 326 is compared to entries 322 to determine a match 328, which is output to an application or other receiving entity or process (not shown). According to an embodiment, for example, in a TCAM, input bit string 326 can be simultaneously compared to one, all or a plurality of entries stored in data structure 320, and a selected one or more matches 328 can be output. According to another embodiment, data structure 320 is implemented as a linked list, hash table or other table data structure in a memory, such as memory 306.

Memory 306 may include one or more of such as static random access memory (SRAM), dynamic random access memory (DRAM), FLASH memory or the like. Memory 306 may include instructions executing in the system (e.g. packet processing device) and any packets and associated information during the processing of packets in the device. In various embodiments, memory 306 can also include a persistent data storage medium such as magnetic disk, optical disk, flash memory, or the like. Such computer-readable storage mediums can be utilized for storing software programs and/or logic instructions that implement the functionality of one or more components of system 300. Moreover, memory 306 may include input packet 324 that, according to an embodiment, is to be compared by field compare module 312 to lookup table 304. For example, input packet 324 may be received via an input interface (not shown) that connects system 300 to a network (not shown). Input packet 324 may include a packet format such as that illustrated in FIG. 1B.

Memory storing module 310 operates to store ranges in a lookup table 304, such as, for example, in a TCAM or other memory. Memory storing module 310 may, according to an embodiment, include the processing logic described below in relation to FIGS. 4, 6 and 7.

Field compare module 312 operates to compare one or more fields to entries in a lookup table. According to an embodiment, one or more selected fields from an incoming data packet are compared to entries of a TCAM. According to another embodiment, the selected fields are compared to entries of a lookup table in memory, such as, in RAM. In yet other embodiments, fields may be compared to both, TCAM and memory structures. Comparing the field to the TCAM or other lookup table is performed in order to determine one or more matching entries. A match may be an exact match or partial match. As described elsewhere in this disclosure, the use of wildcards in entries enables determining partial matches. Field compare module may, according to an embodiment, include the processing logic described in relation to FIG. 5 below.

Processing module 314 operates to process a packet in accordance with the match output by the field compare module 312 and/or the lookup table 304. Processing may include routing and/or forwarding, header processing, packet classification, intrusion prevention, database lookup, or any other type of processing that is performed on a packet or other message upon determining a category to which the packet or other message belongs.

Interconnection bus 316 may include one or more interconnected bus structures that communicatively couple the various modules of packet processing device 300. Interconnection bus 316 may include, for example, a bus such as, an Advanced High Performance Bus (AHB) that uses a bus protocol defined in the AMBA Specification version 2 published by ARM Ltd, or other internal component interconnection mechanism.

Figure 4:
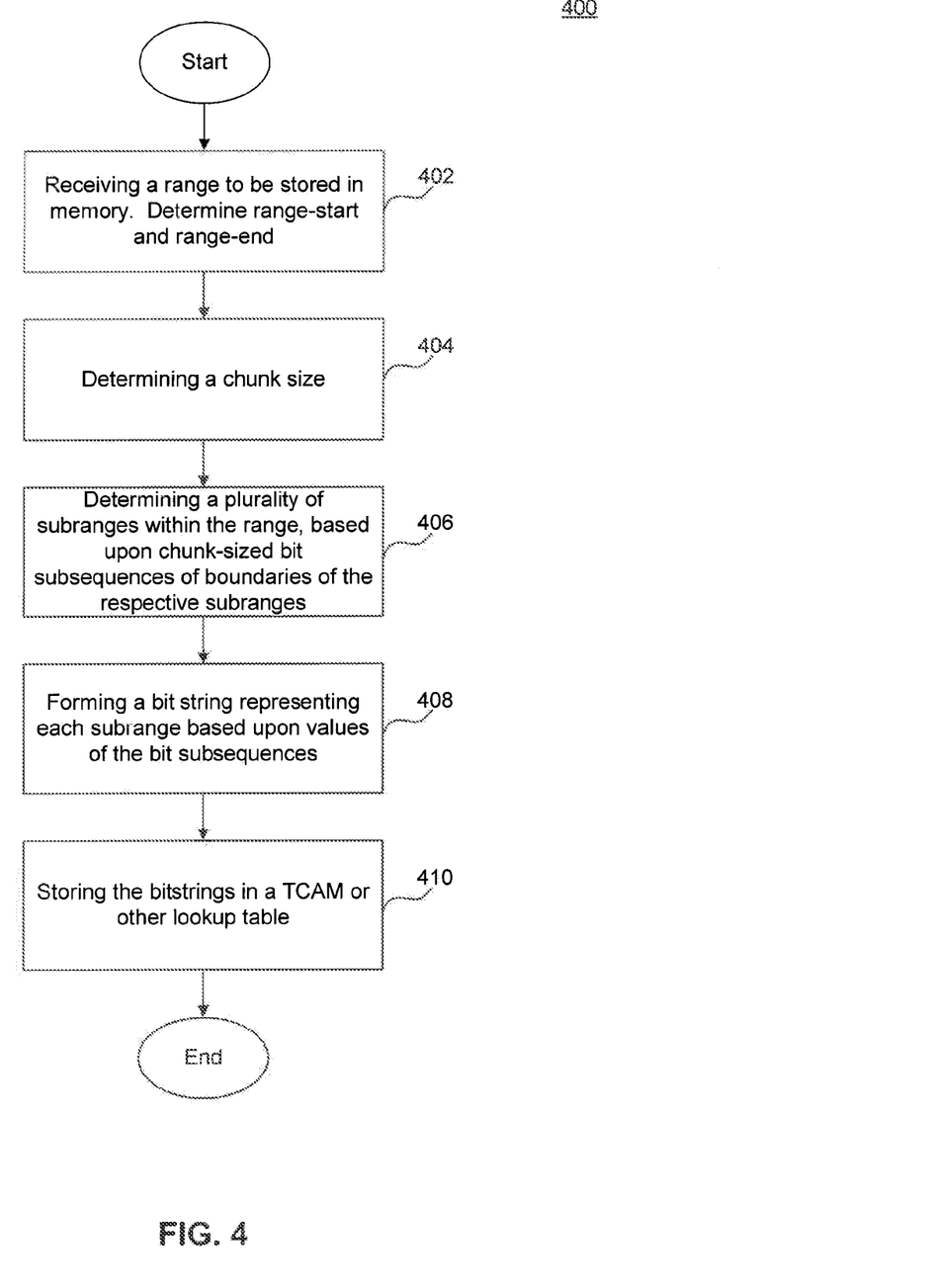
FIG. 4 illustrates a flowchart of a method for storing a range of integer values in a memory, according to an embodiment of the present disclosure.

FIG. 4 illustrates a flowchart of a method 400 (steps 402-410) for storing a range of integer values in a memory, according to an embodiment of the present disclosure. Not all of the steps 402-410 are required, and steps 402-410 may occur in an order different from that shown in FIG. 4. Method 400 can be used, in an embodiment, to store a range of integers in a TCAM to be used in packet field lookup operations. Method 400 may be implemented by, for example, lookup table 304 and memory storing module 310 described in relation to FIG. 3.

At step 402, a range of integers to be stored in a lookup table is received. The range may be received as user manual input, or a machine-generated input. For example, the range may be a user provided parameter that is configured during system initialization. In another embodiment, the range may be automatically determined by the system based on one or more other parameters. For example, an integer range may be automatically determined by the system based upon user configured choices of protocols to be recognized in incoming packets. The boundary points, i.e., the start and end points, of the range are determined.

At step 404, a chunk size is determined. The term "chunk size" refers to the size, in bits, of the groups of sequential bits from a binary representation of a boundary point of a range or a subrange. A group of sequential bits in the binary representation of a boundary point may be referred to as subsequence of bits (also "bit subsequence"). Item 204 in FIG. 2A is a bit subsequence, which may also be referred to as a chunk. In the illustration of FIG. 2A, the subsequences (except for the subsequence with the most significant bits in each bit sequence) have a length (or chunk size) of 3 bits.

The chunk size may affect aspects of the lookup in embodiments. The chunk size, for example, affects the length of the TCAM entries. According to an embodiment, as the chunk size is increased, the length of the TCAM entries also increases. Moreover, the number of TCAM entries decreases when the chunk size is increased. In effect, the chunk size determines the number of bits in a bit substring, such as bit substring 208, in a TCAM entry. Thus, the chunk size may be determined based upon considering a desired size of each TCAM entry and/or desired number of TCAM entries.

Figure 6:
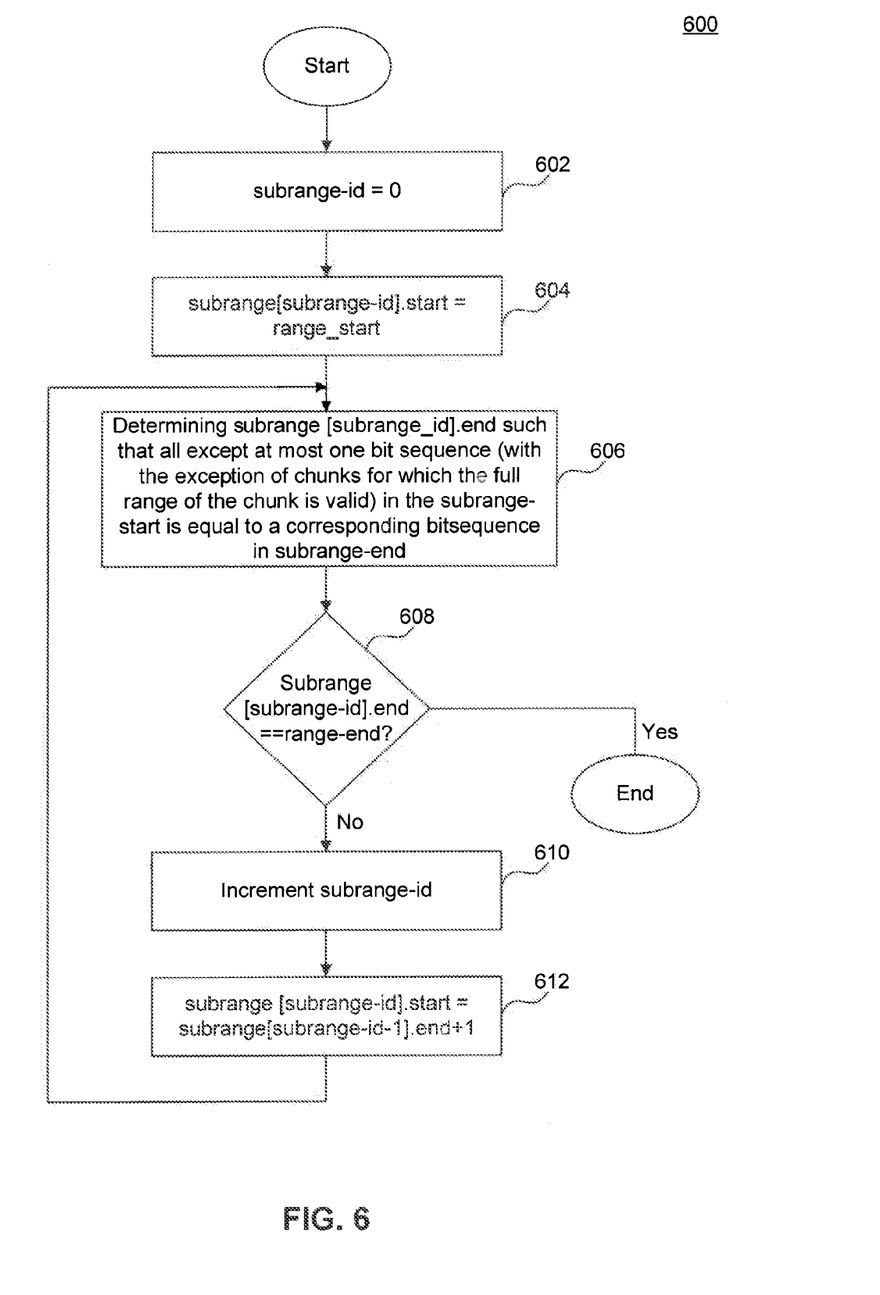
FIG. 6 illustrates a flowchart of a method for determining subranges within a range, in accordance with an embodiment.

At step 406, a plurality of subranges are determined within the received input range. The determined subranges are based upon the chunk-sized bit subsequences from binary representations of the boundaries of respective subsequences. The subranges may be determined in accordance with method 600 described below.

At step 408, for each subrange determined in step 406, a bit string is generated. The bit string is a bit representation of the subrange. More specifically, the bit string includes a plurality of bit substrings, and each bit substring is a bit representation of integers that can validly occur between the boundary points of the subrange in the corresponding chunk.

Figure 7:
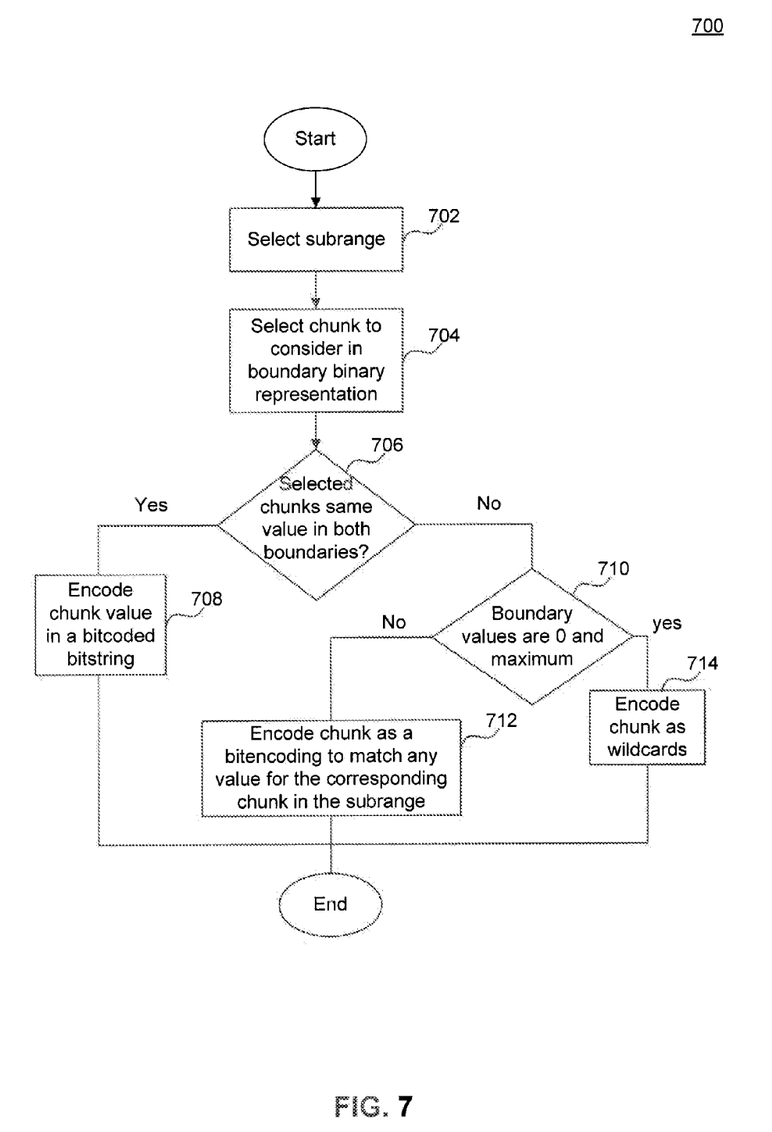
FIG. 7 illustrates a flowchart of a method for encoding a subrange, in accordance with an embodiment.

At step 410, the determined subranges, in the form of bit strings, are stored in a TCAM. According to another embodiment, the subranges are stored in another memory in a data structure, such as, but not limited to, a linked list or hash table. The stored subranges can then be used to determine whether an input packet matches one or more of the stored entries. The encoding and/or storing of the bit strings to the TCAM or other memory may be performed in accordance with method 700 described below.

Although what is illustrated is the storing of single fields as entries, it noted that an entry in a TCAM or lookup table, according to other embodiments, can include combinations of two or more fields as well. For each field, the stored bit string can be generated as described in relation to FIG. 4.

Figure 5:
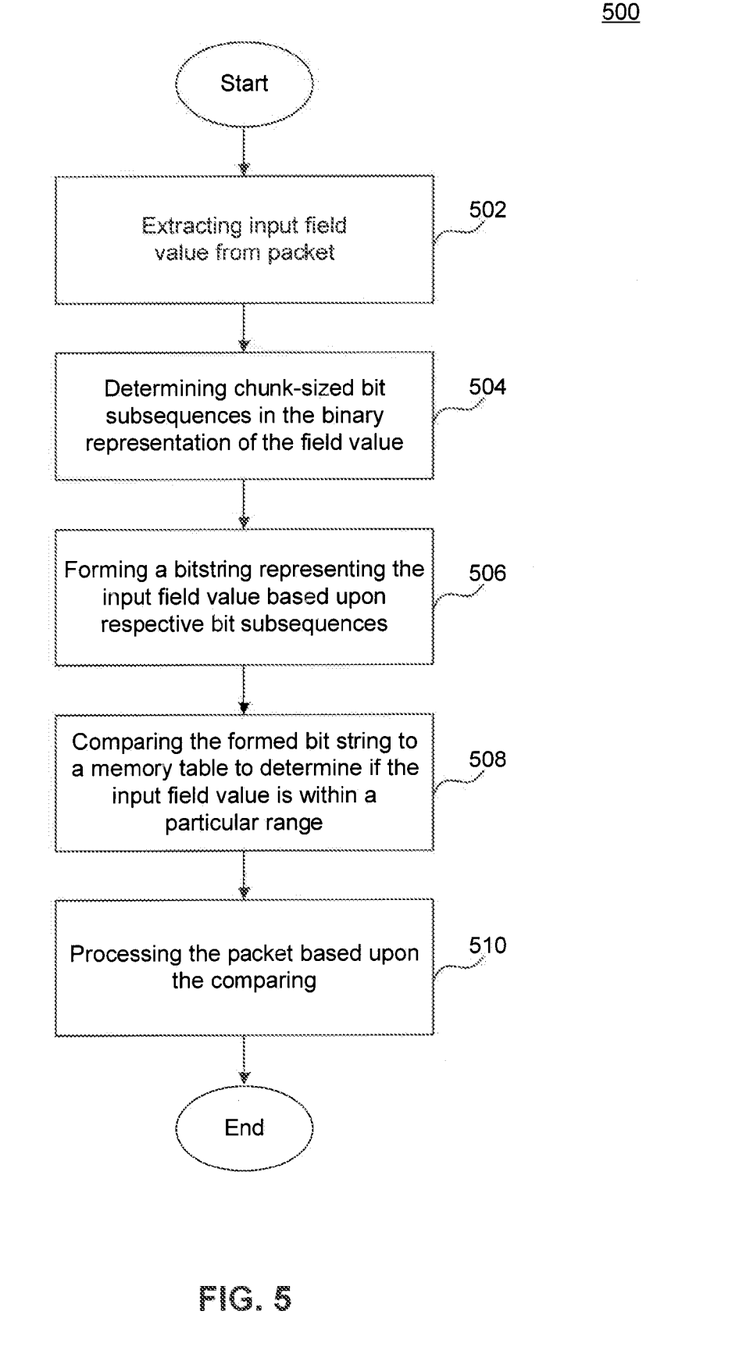
FIG. 5 illustrates a flowchart of a method for comparing an input field to a range of integer values, according to an embodiment of the present disclosure.

FIG. 5 illustrates a flowchart of a method 500 (steps 502-510) for comparing an incoming packet to a range of integer values, according to an embodiment of the present disclosure. Not all of the steps 502-510 are required, and steps 502-510 may occur in an order different from that shown in FIG. 5. Method 500 can be used, in an embodiment, to compare one or more fields of an input packet to a lookup table. Method 500 may be implemented by, for example, lookup table 304 and field compare module 312 described in relation to FIG. 3.

At step 502, the value of a selected field from an input packet is determined. In accordance with an embodiment, the input packet may be a packet that entered a packet processing device, such as, for example, system 300, through an input interface. The input packet may have a header portion and a data portion, and the header portion may include one or more fields. According to an embodiment, the input packet may have a format similar to FIG. 1B. Selected fields may be used to compare the packet to a TCAM or other lookup table. Determining the value includes identifying the bits that correspond to the particular selected field.

At step 504, the field value is represented in binary and chunks are determined. According to an embodiment, the length of the binary string representation of the field value from the input packet is configured to be equal to the length of the binary string representations of the configured ranges and subranges in a lookup table. The chunk size may be a configuration parameter. As done in the case of a boundary point of a range or subrange, the binary representation of a selected field of an input packet is grouped to chunk-sized subsequences.

At step 506, a bit string that includes a plurality of bit substrings is formed to represent the field value to be looked up. Each bit substring bit-wise represents the value of a respective chunk from the binary representation of the selected field. Similar to the bit substrings (such as that shown as item 208 in FIG. 2A) configured for TCAM entries, the bit substrings used in representing the field value of an incoming packet have a reserved bit for each distinct valid integer that can be represented in a chunk.

At step 508, a bit string representing a field of an input packet ("input field bit string") is compared to a lookup table. According to an embodiment, the input field bit string is compared to a TCAM to determine a match. As described above, an input field bit string can simultaneously be compared to all or a plurality of TCAM entries. According to another embodiment, the compare may be performed against another memory data structure. The compare operation results in one or more matches being determined. The one or more matches indicate whether the input field value is within the range, and also the subrange which matches.

At step 510, the input packet is processed based upon the one or more matches determined at step 508. According to an embodiment, the lookup performed in step 508 determines the next hop for packet forwarding, and the packet is forwarded in accordance with the one or more matched TCAM entries. Other example embodiments include, but are not limited to, selecting packets for processing by local applications, performing packet processing functions such as fragmentation and reassembly or field value changes, selecting packets to be discarded or to be prioritized, and the like.

Method 500 above was described in relation to the use of a TCAM or other lookup table to compare a single field of incoming packets. However, a similar process is performed to perform lookup based upon any combination of field values. In the event that multiple fields are matched for each incoming packets, each entry in the TCAM or lookup table would comprise a concatenation of values corresponding to several fields and the value corresponding to each field will be generated as, for example, described in relation to FIG. 4. Similarly the input value which is compared to the lookup table would comprise several field values of the input packet, and each field value can be formulated in a manner similar to that described in relation to FIG. 5.

FIG. 6 illustrates a flowchart of a method 600 (steps 602-612) for determining subranges within a range, in accordance with an embodiment. Not all of the steps 602-612 are required, and steps 602-612 may occur in an order different from that shown in FIG. 6. Method 600 can be used, in an embodiment, to determine a plurality of subranges within a particular range. Method 600 may be implemented by, for example, memory storing module 310 described in relation to FIG. 3.

At step 602, a subrange identifier ("subrange-id") is initialized. The subrange-id is a counter representing a sequential numbering of subranges within a particular range. In the described embodiment, the subrange-id is initialized to 0, and the subranges are determined from the low end to the high end of the range.

At step 604, the first subrange is initialized to the low end of the range. The initialization can be performed, as shown, by setting the starting boundary of the first subrange to the start boundary point of the range (e.g. range_start). For example, as shown in FIG. 2A for the range 11-54, the first subrange (subrange-id 0) has its starting boundary set to the start boundary point 11 of the range.

Steps 606-612 may be iteratively performed until the entirety of the range is covered by subranges. At step 606, for the current subrange, determine an end boundary point such that all except at most one element of the bit sequence of the start boundary point of the subrange is equal to the corresponding element in the end boundary point. The element referred to here may be a bit subsequence in the binary representation of the boundary points or a decimal number from the decimal sequences corresponding to the boundary points. An exception to the rule of having all except at most one element of the bit sequence of the start boundary point of the subrange being equal to the corresponding element in the end boundary point is provided for when the pair of corresponding elements from the two boundary points cover the full range of the valid values for the corresponding chunk. The reader is referred to the description in relation to FIGS. 2A and 2B for further information regarding the determining of subranges.

According to an embodiment, the determining of the subrange end boundary point can be performed by receiving user input. According to another embodiment, the determination of the subrange end boundary point can be performed automatically as described below.

The binary representation of the start boundary point is grouped into chunks, and the value of each chunk is determined. For purposes of illustration and discussion, we assume that the values of the respective chunks are determined as decimal integers. In embodiments, however, the value of the chunks may be determined in various other forms, including by maintaining the chunks in binary form. When determined in decimal, the start boundary point can be represented as a decimal sequence. A "decimal sequence" was described above, and examples are illustrated in item 205 of FIG. 2A. In FIG. 2A, the start boundary point of the first subrange is represented as (0 1 3).

The subrange end boundary point may be initialized with an equal number of chunks to the start boundary point.

Each chunk of the subrange start boundary point is considered in order from the least valued chunk (e.g. right most) to the highest valued chunk (e.g. left most). For example, for the start boundary point (0 1 3) of the first subrange shown in FIG. 2A, the chunks values 3, 1 and 0 are considered in order.

If the current start boundary chunk is 0 and the chunks right of (if any) the current end boundary chunk are at maximum chunk value, set the current end boundary chunk to the maximum valid value. The maximum valid value is either the maximum chunk value or the maximum value assignable to the chunk without overstepping the range boundary.

If the current start boundary chunk is 0 and the current end boundary chunk is the maximum chunk value or if the current start and end boundary chunks are the same value (e.g. first chunks of the subrange (0 1 3)-(0 1 7) in FIG. 2A), then proceed to consider the chunk to the left of the current chunk and repeat the previous step for the next chunk (e.g., move a current chunk pointer to the left of its current position). If no more chunks to the left of current, then the subrange has been determined.

Otherwise, if the current start boundary chunk and the current end boundary chunk have different values, then set the chunks to the left of current in the end boundary to same values as the corresponding elements in the start boundary. The subrange has been determined.

At step 608, it is determined whether the current subrange end point is at the end point of the range. If yes, then all subranges have been determined and processing of method 600 has completed.

If no, then, at step 610, the subrange identifier is incremented, in order to begin determining the next subrange. This in effect means that the references to current subrange in the next steps refer to the subrange to be determined next, i.e., subrange corresponding to the new subrange identifier.

Then, at step 612, the current subrange start is determined as the next integer after the previous subrange end point. According to an embodiment, the current subrange start is determined by adding 1 to the previous subrange end.

After step 612, processing of method 600 proceeds to step 606 to determine the current subrange end.

FIG. 7 illustrates a flowchart of a method 700 (steps 702-714) for encoding a subrange, in accordance with an embodiment. Not all of the steps 702-714 are required, and steps 702-714 may occur in an order different from that shown in FIG. 7. Method 700 can be used, in an embodiment, to encode a TCAM entry. Method 700 may be implemented by, for example, lookup table 304 and memory storage module 310 described in relation to FIG. 3.

At step 702, a subrange to be encoded is selected. The subranges may have been determined in accordance, for example, with FIG. 6.

At step 704, a chunk of the subrange is selected. According to an embodiment, respective elements of the decimal sequences corresponding to the boundary points of the subrange may be accessed as chunks. According to another embodiment, the respective bit subsequences of the bit sequences corresponding to the boundary points of the subrange may be accessed as chunks. Steps 704-714 are repeated until all chunks of the selected subrange are stored in a TCAM or other lookup table data structure. According to an embodiment, beginning with the rightmost (e.g. chunk having the least significant bits) chunk, chunks from the bit string are selected sequentially for processing using steps 704-714.

At step 706, it is determined whether the current chunk has the same value in both the subrange start sequence and the subrange end sequence. If yes (i.e., the same value in both sequences), then at step 708, the chunk value is encoded in the bit string. The encoding is performed bit-wise, e.g., the bit substring (of the bit string) corresponding to the current chunk has a reserved bit for each valid value of the chunk. The encoding of the bit substring is performed, according to an embodiment, by setting to "1" the reserved bit corresponding to the value to be encoded and all other bits to the right (e.g. bits of lower value) of the reserved bit. For example, as illustrated in FIG. 2A, encoding the second element (chunk) in the subrange (0 6 0)-(0 6 6) results in the bit substring "0111111" setting the six least significant bits to "1" and remaining bits to "0".

If, at step 706, it is determined that the current chunk values in the start and end boundary points are different, then processing of method 700 continues to step 710. At step 710, it is determined whether valid values for the current chunk include the full range of that chunk. According to an embodiment, current chunk values of 0 for the start boundary point and a maximum chunk value (e.g. all bits in the chunk are 1) for the end boundary point are determined to indicate that the valid values for the current chunk include the full range of the chunk.

If yes (e.g., valid values for the current chunk includes the full range of the chunk), then, at step 714, the chunk is encoded as wildcards. For example, in FIG. 2A, the third element of the subrange (0 2 0)-(0 5 7) is encoded as "xxxxxxx" indicating that any of the 7 bits can be either "1" or "0".

If no (e.g., valid values for the current chunk does not include the full range of the chunk), then the valid values for the current chunk include a range of values. The corresponding bit substring, therefore, is encoded to accommodate the entire range of valid values for the current chunk between the start subrange and the end subrange. For example, as illustrated in FIG. 2A, encoding the third element (chunk) in the subrange (0 1 3)-(0 1 7) results in the bit substring "xxxx111": the lowest valid value for the chunk, 3, is recorded by setting the three least significant bits to "1", and bits 4-7 are set to the wildcard character to indicate that each of those bits can be either "1" or "0".

As stated above, steps 704-714 are repeated to encode each chunk. Encoding of the respective chunks from results in an entry stored in TCAM or other data structure in memory.

The representative functions of the communications device described herein can be implemented in hardware, software, or some combination thereof. For instance, processes 400, 500, 600 and 700 can be implemented using computer processors, computer logic, ASIC, FPGA, DSP, etc., as will be understood by those skilled in the arts based on the discussion given herein. Accordingly, any processor that performs the processing functions and/or algorithms described herein is within the scope and spirit of the present disclosure.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method for storing a range of integer values in a memory, comprising:
   determining a subrange within the range, so that, in a first plurality of bit subsequences and a second plurality of bit subsequences from binary representations respectively of a start value and an end value of the subrange, all except at most one bit subsequence in the first plurality of bit subsequences are either equal in value to a corresponding bit subsequence in the second plurality of bit subsequences or have a value of 0 and a corresponding bit subsequence of the second plurality of bit subsequences has a maximum value;
   forming a first bit string based upon values of the first plurality of bit subsequences and the second plurality of bit subsequences; and
   storing the first bit string in the memory.

2. The method of claim 1, wherein the storing comprises storing the first bit string in a ternary content addressable memory (TCAM).

3. The method of claim 1, wherein the forming comprises:
   generating respective bit substrings corresponding to each pairing of a bit subsequence from the first plurality of bit subsequences and a corresponding bit subsequence from the second plurality of bit subsequences; and
   concatenating the generated bit substrings to create the first bit string.

4. The method of claim 3, wherein a length of each of the respective bit substrings is at least equal to a maximum value of a bit subsequence from the first plurality of bit subsequences.

5. The method of claim 3, wherein the generating respective bit substrings comprises:
   determining a range of valid values corresponding to said each pairing; and
   setting bit values in each bit substring based upon the determined range of valid values, wherein respective bit positions in each bit substring are associated with a value in the determined range of valid values.

6. The method of claim 5, wherein the setting bit values in each bit substring comprises:
   setting a first m bits of the bit substring to 1, wherein m is a valid value of the bit subsequence from the first plurality of bit subsequences; and
   setting n bits following the first m bits to a wildcard, wherein n is a difference between the bit subsequence from the first plurality of bit subsequences and the bit subsequence from the second plurality of bit subsequences.

7. The method of claim 1, further comprising:
   determining a third plurality of bit subsequences from a binary representation of a field value of a data packet;
   forming a second bit string based upon values of the third plurality of bit subsequences;
   comparing the second bit string to the stored first bit string; and
   processing the data packet based upon the comparing.

8. The method of claim 7, wherein the first, second and third pluralities of bit subsequences are determined in accordance with a predetermined bit subsequence length.

9. The method of claim 7, wherein a number of bit subsequences in the first, second and third pluralities of bit subsequences are equal.

10. The method of claim 7, wherein the forming the second bit string comprises:

generating respective second bit substrings corresponding to each bit subsequence from the third plurality of bit subsequences; and concatenating the second bit substrings to create the second bit string.

11. The method of claim 10, wherein the generating respective second bit substrings comprises:

determining a value of the corresponding bit subsequence from the third plurality of bit subsequences; and setting bit values in the second bit substring based upon the determined value, wherein each bit position in the second bit substring is associated with a respective determined value.

12. The method of claim 11, wherein the setting bit values in the second bit substring comprises:

setting a first m bits of the second bit substring to 1, wherein m is a value of the bit subsequence from the third plurality of bit subsequences.

13. The method of claim 1, further comprising:

configuring one or more of a length of bit subsequences of the first plurality of bit subsequences and the second plurality of bit subsequences or a length of bit substrings applied to the first bit substring based upon memory characteristics.

14. The method of claim 1, further comprising:

configuring a length of bit subsequences of the first plurality of bit subsequences and the second plurality of bit subsequences based upon a predetermined length of bit strings, wherein the predetermined length is applied to the first bit string.

15. The method of claim 1, further comprising:

configuring a length of bit subsequences of the first plurality of bit subsequences and the second plurality of bit subsequences based upon a size of the range.

16. A system, comprising:

a processor;

at least one memory coupled to the processor;

a memory storing module configured to:

determine a subrange within a range, so that, in a first plurality of bit subsequences and a second plurality of bit subsequences from binary representations respectively of a start value and an end value of the subrange, all except at most one bit subsequence in the first plurality of bit subsequences are equal in value to a corresponding bit subsequence in the second plurality of bit subsequences or have a value of 0 and a corresponding one of the second plurality has a maximum value;

form a first bit string based upon values of the first plurality of bit subsequences and the second plurality of bit subsequences; and store the first bit string in the at least one memory.

17. The system of claim 16, wherein the at least one memory includes a ternary content addressable memory (TCAM).

18. The system of claim 16, further comprising:

a packet field comparing module configured to:

determine a third plurality of bit subsequences from a binary representation of a field value of a data packet;

form a second bit string based upon values of the third plurality of bit subsequences; and compare the second bit string to the stored first bit string.

19. The system of claim 18, further comprising:

a packet processing module configured to process the data packet based upon the comparing.

20. A non-transitory computer readable storage medium having instructions recorded thereon, that when executed by a processor, causes the processor to perform a method for storing a range of comparison values in a memory comprising:

determining a subrange within the range, so that, in a first plurality of bit subsequences and a second plurality of bit subsequences from binary representations respectively of a start value and an end value of the subrange, all except at most one bit subsequence in the first plurality of bit subsequences are equal in value to a corresponding bit subsequence in the second plurality of bit subsequences or have a value of 0 and a corresponding one of the second plurality of bit subsequences has a maximum value;

forming a first bit string based upon values of the first plurality of bit subsequences and the second plurality of bit subsequences; and storing the first bit string in the memory.

* * * * *

UNITED STATES PATENT AND TRADEMARK OFFICE
CERTIFICATE OF CORRECTION

| | | |
|---|---|---|
| PATENT NO. | : 9,032,142 B2 | Page 1 of 1 |
| APPLICATION NO. | : 13/535984 | |
| DATED | : May 12, 2015 | |
| INVENTOR(S) | : Yan Sun | |

It is certified that error appears in the above-identified patent and that said Letters Patent is hereby corrected as shown below:

In the Specification

Column 12, line 44, please replace "wherein in is" with --wherein m is--

Signed and Sealed this
Twenty-ninth Day of September, 2015

Michelle K. Lee
*Director of the United States Patent and Trademark Office*